United States Patent
Eid et al.

(10) Patent No.: US 11,933,555 B2
(45) Date of Patent: Mar. 19, 2024

(54) HEAT DISSIPATION DEVICE HAVING ANISOTROPIC THERMALLY CONDUCTIVE SECTIONS AND ISOTROPIC THERMALLY CONDUCTIVE SECTIONS

(71) Applicant: Intel Corporation, Santa Clara, CA (US)

(72) Inventors: Feras Eid, Chandler, AZ (US); Adel Elsherbini, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 17/509,514

(22) Filed: Oct. 25, 2021

(65) Prior Publication Data

US 2022/0042750 A1    Feb. 10, 2022

Related U.S. Application Data

(63) Continuation of application No. 15/957,431, filed on Apr. 19, 2018, now Pat. No. 11,226,162.

(51) Int. Cl.
*H05K 7/20* (2006.01)
*F28F 3/02* (2006.01)
(Continued)

(52) U.S. Cl.
CPC ............ *F28F 3/022* (2013.01); *F28F 13/003* (2013.01); *H01L 23/3677* (2013.01);
(Continued)

(58) Field of Classification Search
None
See application file for complete search history.

(56) References Cited

U.S. PATENT DOCUMENTS 7,851,816 B2 * 12/2010 Dutta ..................... G02B 6/122
                                                                  257/432
10,064,287 B2 * 8/2018 Standing ................ H05K 1/141
(Continued)

OTHER PUBLICATIONS

Notice of Allowance for U.S. Appl. No. 15/957,431, dated Sep. 30, 2021.
Office Action for U.S. Appl. No. 15/957,431, dated Jun. 8, 2021.

*Primary Examiner* — Courtney L Smith
(74) *Attorney, Agent, or Firm* — Essential Patents Group, LLP

(57) ABSTRACT

A heat dissipation device may be formed having at least one isotropic thermally conductive section (uniformly high thermal conductivity in all directions) and at least one anisotropic thermally conductive section (high thermal conductivity in at least one direction and low thermal conductivity in at least one other direction). The heat dissipation device may be thermally coupled to a plurality of integrated circuit devices such that at least a portion of the isotropic thermally conductive section(s) and/or the anisotropic thermally conductive section(s) is positioned over at least one integrated circuit device. The isotropic thermally conductive section(s) allows heat spreading/removal from hotspots or areas with high-power density and the anisotropic thermally conductive section(s) transfers heat away from the at least one integrated circuit device predominately in a single direction with minimum conduction resistance in areas with uniform power density distribution, while reducing heat transfer in the other directions, thereby reducing thermal cross-talk.

20 Claims, 6 Drawing Sheets

(51) Int. Cl.
*F28F 13/00* (2006.01)
*H01L 23/367* (2006.01)
*H01L 23/373* (2006.01)

(52) U.S. Cl.
CPC ...... *H01L 23/3733* (2013.01); *H01L 23/3735* (2013.01); *H05K 7/2039* (2013.01)

(56) References Cited

U.S. PATENT DOCUMENTS

| | | | | |
|---|---|---|---|---|
| 2005/0161662 | A1* | 7/2005 | Majumdar | H01L 21/0237 257/18 |
| 2006/0226551 | A1* | 10/2006 | Awano | H01L 21/76879 257/E21.171 |
| 2009/0121732 | A1* | 5/2009 | Crafts | G01R 1/07357 977/743 |
| 2012/0206882 | A1* | 8/2012 | Mohammed | H01L 23/3735 977/932 |
| 2017/0162550 | A1* | 6/2017 | Das | H01L 23/5385 |
| 2017/0236917 | A1* | 8/2017 | Nowak | H01L 29/785 257/401 |
| 2018/0102470 | A1* | 4/2018 | Das | H01L 23/5384 |
| 2019/0244933 | A1* | 8/2019 | Or-Bach | H01L 27/0688 |

* cited by examiner

HEAT DISSIPATION DEVICE HAVING ANISOTROPIC THERMALLY CONDUCTIVE SECTIONS AND ISOTROPIC THERMALLY CONDUCTIVE SECTIONS

CLAIM FOR PRIORITY

This application is a continuation of, and claims the benefit of priority to U.S. patent application Ser. No. 15/957,431, filed on Apr. 19, 2018, titled "HEAT DISSIPATION DEVICE HAVING ANISOTROPIC THERMALLY CONDUCTIVE SECTIONS AND ISOTROPIC THERMALLY CONDUCTIVE SECTIONS", and which is incorporated by reference in its entirety.

TECHNICAL FIELD

Embodiments of the present description generally relate to the removal of heat from integrated circuit devices, and, more particularly, to a heat dissipation device having at least one anisotropic thermally conductive section and at least one isotropic thermally conductive section, which is used to remove heat from a plurality of integrated circuit devices.

BACKGROUND

Higher performance, lower cost, increased miniaturization of integrated circuit components, and greater packaging density of integrated circuits are ongoing goals of the electronics industry. As these goals are achieved, integrated circuit devices become smaller. Accordingly, the density of power consumption of the components in the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple integrated circuit devices are incorporated in a single package. In such a configuration, heat is generally removed from the multiple integrated circuit devices with a single thermally conductive heat dissipation device, such as a heat spreader. However, differing integrated circuit devices within the integrated circuit package may have differing operating temperatures. Thus, a high heat generating integrated circuit device may dominate the heat transferred into the heat dissipation device, which may hamper the transfer of heat into the heat dissipation device by other integrated circuit devices in the package, e.g. thermal cross-talk. As such, the other integrated circuit devices may exceed their temperature limits and be damaged or destroyed, leading to the failure of the entire integrated circuit package.

Moreover, the integrated circuit devices or different regions within a single integrated circuit device can have different power densities. Thus, there may be integrated circuit devices or regions therein with a uniform power distribution for which a low one-dimensional heat conduction resistance between the integrated circuit device and the heat dissipation device is most critical, and other integrated circuit devices or regions therein with non-uniform power densities and hot spots for which a low heat spreading resistance is desired. Optimizing both resistances simultaneously using a single, uniform, homogeneous heat dissipation device is often not feasible.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
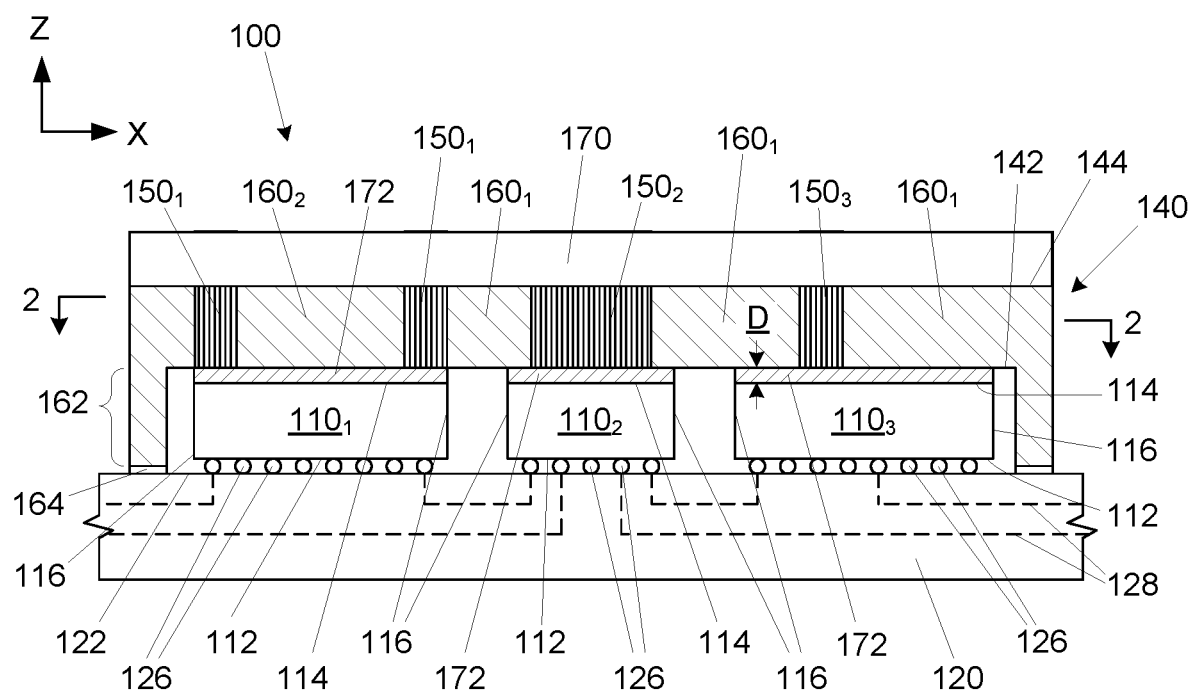
FIG. 1 is a side cross-sectional view of an integrated circuit package including a heat dissipation device comprising anisotropic thermally conductive sections and isotropic thermally conductive sections, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include a heat dissipation device comprising at least one isotropic thermally conductive section (relatively high thermal conductivity in all 3 cartesian directions x, y, and z) and at least one anisotropic thermally conductive section (uniformly high thermal conductivity in at least one direction (e.g. z-direction) and relatively low thermal conductivity in at least one of other direction (e.g. x-direction and/or y-direction)). In one embodiment, the heat dissipation device may be thermally coupled to a plurality of integrated circuit devices such that at least a portion of the isotropic thermally conductive section(s) and/or the anisotropic thermally conductive section(s) is positioned over at least one integrated circuit device. The isotropic thermally conductive section(s) may be positioned to allow for heat spreading/removal from the integrated circuit devices, especially from hotspots or areas with concentrated high-power density. The anisotropic thermally conductive section(s) may be positioned to transfer heat away from the at least one integrated circuit device (e.g. areas with uniform power density distribution and no hotspots) predominantly in a single direction (e.g. z-direction) with minimum conduction resistance, while substantially preventing or minimizing heat transfer in the other directions (e.g. x-direction and/or the y-direction), such that thermal cross-talk between the plurality of integrated circuit devices is reduced.

In the production of integrated circuit packages, integrated circuit devices are generally mounted on substrates, which provide electrical communication routes between the integrated circuit devices and with external components. As shown in FIG. 1, an integrated circuit package 100 may comprise a plurality of integrated circuit devices (illustrated as elements 110$_1$, 110$_2$, and 110$_3$), such as microprocessors, chipsets, graphics devices, wireless devices, memory devices, application specific integrated circuits, combinations thereof, stacks thereof, or the like, attached to a first surface 122 of a substrate 120, such as an interposer, a printed circuit board, a motherboard, and the like, through a plurality of interconnects 126, such as reflowable solder bumps or balls, in a configuration generally known as a flip-chip or controlled collapse chip connection ("C4") configuration. The device-to-substrate interconnects 126 may extend from bond pads (not shown) on a first surface 112 of each of the integrated circuit devices 110$_1$, 110$_2$, and 110$_3$ and bond pads (not shown) on the substrate first surface 122. The integrated circuit device bond pads (not shown) of each of the integrated circuit devices 110$_1$, 110$_2$, and 110$_3$ may be in electrical communication with circuitry (not shown) within the integrated circuit devices 110$_1$, 110$_2$, and 110$_3$. The substrate 120 may include at least one conductive route 128 extending therethrough to form electrical connections from at least one integrated circuit device 110$_1$, 110$_2$, and 110$_3$ to external components (not shown) and/or between at least two of the integrated circuit devices 110$_1$, 110$_2$, and 110$_3$.

The substrate 120 may be primarily composed of an appropriate dielectric material, including, but not limited to, bismaleimine triazine resin, fire retardant grade 4 material, polyimide materials, glass reinforced epoxy matrix material, and the like, as well as laminates or multiple layers thereof. The substrate conductive routes 128 may be composed of any conductive material, including but not limited to metals, such as copper and aluminum, and alloys thereof. As will be understood to those skilled in the art, the substrate conductive routes 128 may be formed as a plurality of conductive traces (not shown) formed on layers of dielectric material (constituting the dielectric material of the substrate 120), which are connected by conductive vias (not shown). Furthermore, the substrate 120 may be either a cored or a coreless substrate.

The device-to-substrate interconnects 126 can be made of any appropriate material, including, but not limited to, solders materials. The solder materials may be any appropriate material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the integrated circuit devices 110$_1$, 110$_2$, and 110$_3$ are attached to the substrate 120 with device-to-substrate interconnects 126 made of solder, the solder is reflowed, either by heat, pressure, and/or sonic energy to secure the solder between the integrated circuit devices 110$_1$, 110$_2$, and 110$_3$ and the substrate 120.

As further illustrated in FIG. 1 and according to one embodiment of the present description, a heat dissipation device 140 may be thermally coupled with second surfaces 114 (opposing the first surfaces 112) of the integrated circuit devices 110$_1$, 110$_2$, and 110$_3$. The heat dissipation device 140 may comprise at least one anisotropic thermally conductive section (illustrated as elements 150$_1$, 150$_2$, and 150$_3$) and at least one isotropic thermally conductive section (illustrated as elements 160$_1$ and 160$_2$). In one embodiment, at least one anisotropic thermally conductive section 150$_1$, 150$_2$, 150$_3$ may extend from a first surface 142 of the heat dissipation device 140 to an opposing second surface 144 of the heat dissipation device 140.

It is understood that the second surface 144 of the heat dissipation device 140 may be in thermal contact with an active heat removal device 170 (shown as a generic block in FIG. 1), including but not limited to a heat pipe, a high surface area dissipation structure with a fan (such as a structure having fins or pillars/columns formed in a thermally conductive structure), a liquid cooling device, and the like, which removes heat from the heat dissipation device 140, as will be understood to those skilled in the art.

The isotropic thermally conductive sections 160$_1$ and 160$_2$ may be made of any appropriate isotropic thermally conductive material. In one embodiment of the present description, the isotropic thermally conductive sections 160$_1$ and 160$_2$ may be made of at least one metal material, alloys of more than one metal, and combinations thereof, including, but not limited to, copper, nickel, aluminum, alloys, laminated metals including coated materials (such as nickel coated copper), and the like. For the purposes of the present description, the term "thermally conductive structure" and/or "thermally conductive material", as it relates to the isotropic thermally conductive sections, such as elements 160$_1$ and 160$_2$, means a structure or material having a thermal conductivity "k" of about 10 W/m*K or greater.

Figure 3:
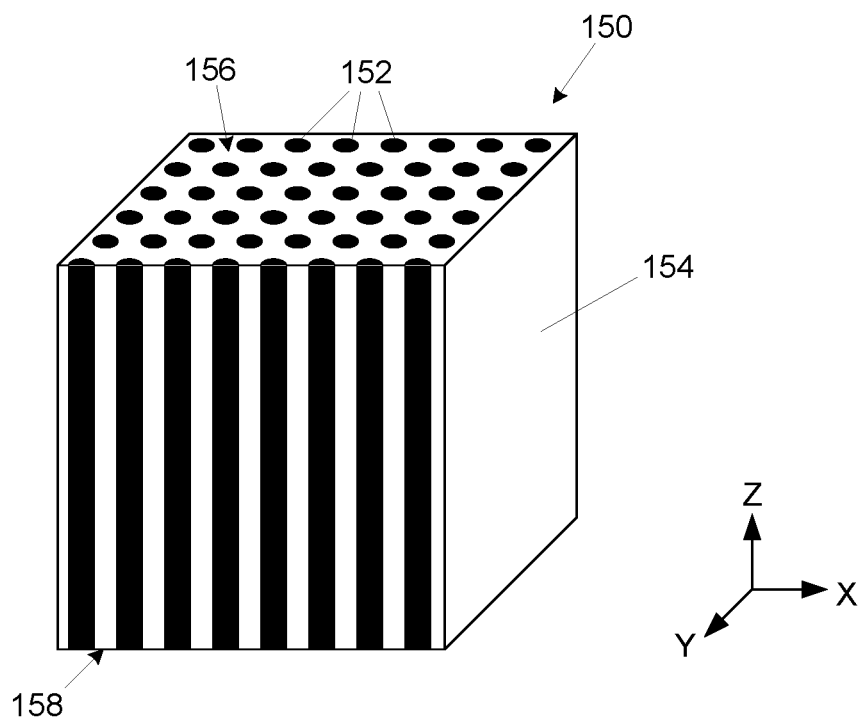
FIG. 3 is an oblique view of an anisotropic material, according to one embodiment of the present description.

The anisotropic thermally conductive sections 150$_1$, 150$_2$, 150$_3$ (generically element 150 in FIGS. 3 and 4) may be made of any appropriate anisotropic thermally conductive material. In one embodiment of the present description, as shown in FIG. 3, the anisotropic thermally conductive sections 150 may be made of thermally conductive rods or pillars 152 embedded in a thermally insulative material 154. The thermally conductive rods or pillars 152 may comprise carbon nanotubes or nanorods with their longitudinal axis along the z-direction. The thermally conductive rods or pillars 152 may be exposed at a bottom surface 158 of the anisotropic thermally conductive section 150 to facilitate thermal coupling with the integrated circuit device $110_1$, $110_2$, $110_3$ (see FIG. 1) and may be exposed at a top surface 156 of the anisotropic thermally conductive section 150 to facilitate thermal coupling with the active heat removal device 170 (see FIG. 1).

Figure 4:
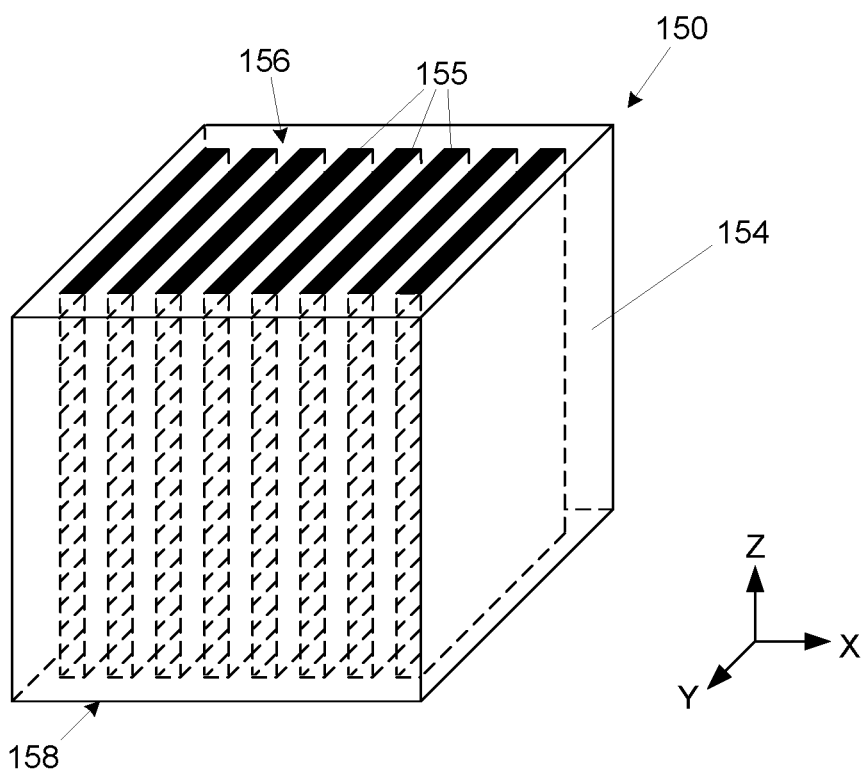
FIG. 4 is an oblique view of an anisotropic material, according to another embodiment of the present description.

In a further embodiment of the present description, as shown in FIG. 4, the anisotropic thermally conductive sections $150_1$, $150_2$, $150_3$ may be made of two-dimensional thermally conductive sheets 155 embedded in the thermally insulative material 154. The two-dimensional thermally conductive sheets 155 may comprise any appropriate thermally conductive material, including, but not limited to graphene sheets, with their planes (shown as y-z planes) oriented vertically along the z-direction. The thermally conductive sheets 155 may be exposed at the bottom surface 158 of the anisotropic thermally conductive section 150 to facilitate thermal coupling with the integrated circuit device $110_1$, $110_2$, $110_3$ (see FIG. 1) and may be exposed at the top surface 156 of the anisotropic thermally conductive section 150 to facilitate thermal coupling with the active heat removal device 170 (see FIG. 1). The thermally insulative material 154 may be made of any appropriate thermally insulative material, including, but not limited to, low conductivity polymers (such as epoxies and silica-filled epoxies), ceramics, polymer/ceramic composites, and the like.

The thermally conductive rods or pillars 152 and/or the two-dimensional thermally conductive sheets 155 of the anisotropic thermally conductive sections $150_1$, $150_2$, $150_3$ may have higher thermal conductivity (e.g. in the z-direction or "kz") than the overall thermal conductivity "k" of the isotropic thermally conductive sections $160_1$ and $160_2$. Thus, the use of the anisotropic thermally conductive sections $150_1$, $150_2$, $150_3$, in select areas with the remainder being the isotropic thermally conductive sections $160_1$ and $160_2$, in addition to limiting thermal cross-talk, can lead to a lower conduction resistance in z-direction than if an isotropic thermally conductive material (such as used for the isotropic thermally conductive sections $160_1$ and $160_2$) was used throughout the entire heat dissipation device 140.

For the purposes of the present description, the term "thermally conductive structure" and/or "thermally conductive material", as it relates to the anisotropic thermally conductive sections $150_1$, $150_2$, $150_3$, means a structure or material having a thermal conductivity "k" of about 10 W/m*K or greater. Additionally, for the purposes of the present description, the term "thermally insulative material", as it relates to the anisotropic thermally conductive sections $150_1$, $150_2$, $150_3$, means a structure or material having a thermal conductivity "k" of about 1.0 W/m*K or less.

Figure 2:
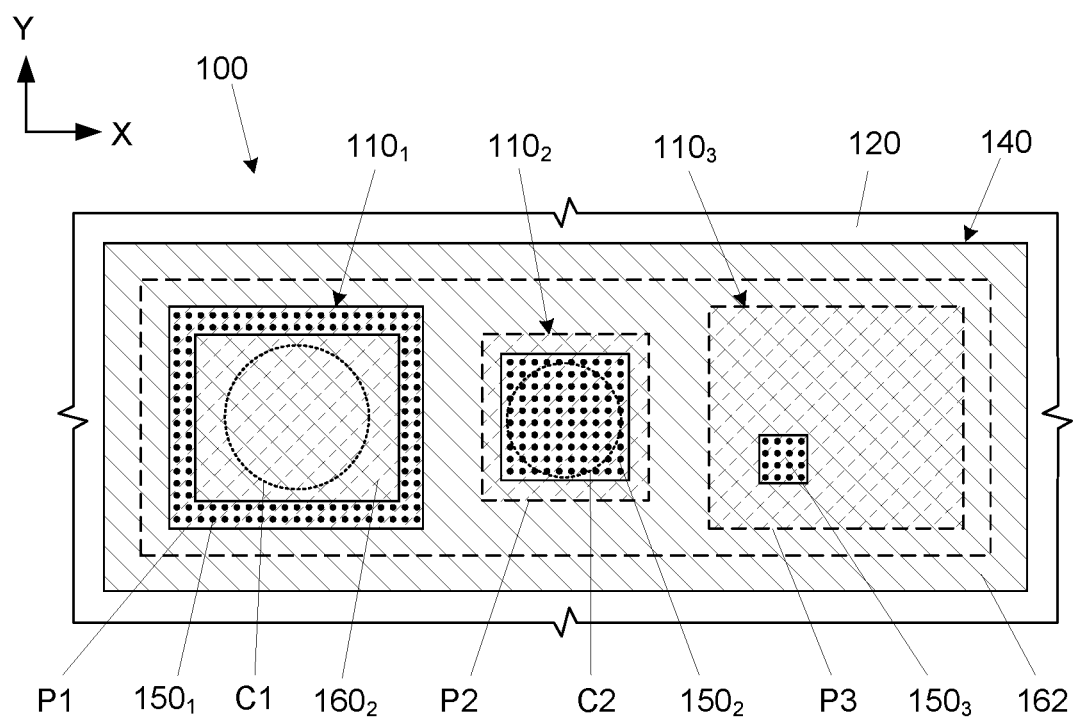
FIG. 2 is a cross-sectional view along line 2-2 of FIG. 1, according to an embodiment of the present description.

FIG. 2 illustrates a cross-sectional view along line 2-2 of FIG. 1, wherein the integrated circuit devices $110_1$, $110_2$, and $110_3$ are shown in shadow lines for clarity. As shown in FIG. 2, each of the integrated circuit devices $110_1$, $110_2$, and $110_3$ may have a periphery P1, P2, P3, respectively, which is defined by sidewalls 116 (see FIG. 1) of each of the integrated circuit devices $110_1$, $110_2$, and $110_3$. In one embodiment, as shown in FIGS. 1 and 2, at least one hotspot (not shown) may be located near a center area C1 (see FIG. 2 in small-dash circle) of a first integrated circuit device (labeled as element $110_1$), which requires heat spreading and, thus, the isotropic thermally conductive section $160_2$ is positioned over the hot spot (not shown) or center area C1 (see FIG. 2). The first integrated circuit device $110_1$ may further include uniform power areas (not specifically illustrated) located near the sidewalls 116 (see FIG. 1) or periphery P1 (see FIG. 2) thereof, which requires transporting heat to the active heat removal device 170 (see FIG. 1) at a minimal thermal conduction resistance in the z-direction, and, thus, the anisotropic thermally conductive section $150_1$ may be aligned vertically (in the z-direction) over the integrated circuit device $110_1$, i.e. substantially perpendicular to the second surface 114 of the integrated circuit device $110_1$ proximate to the sidewalls 116 (see FIG. 1) or periphery P1 (see FIG. 2) thereof.

In a further embodiment, also shown in FIGS. 1 and 2, at least one uniform power area (not specifically illustrated) may be located near a center area C2 (see FIG. 2 in small-dash circle) of a second integrated circuit device (labeled as element $110_2$), which requires transporting heat to the active heat removal device 170 (see FIG. 1) at a minimal thermal conduction resistance in the z-direction, and, thus, the anisotropic thermally conductive section $150_2$ may be aligned vertically (in the z-direction) over the integrated circuit device $110_2$, i.e. substantially perpendicular to the second surface 114 of the integrated circuit device $110_2$ proximate to the center area C2 of the second integrated circuit device $110_2$. The second integrated circuit device $110_2$ may further include at least one hotspot (not shown) located near the sidewalls 116 (see FIG. 1) or periphery P2 (see FIG. 2) thereof, which requires heat spreading, and, thus, the isotropic thermally conductive section $160_1$ or a portion thereof may be aligned vertically (in the z-direction) over the integrated circuit device $110_2$, i.e. substantially perpendicular to the second surface 114 of the integrated circuit device $110_2$. In still a further embodiment, anisotropic thermally conductive section $150_3$ may be formed in a specific location over the third integrated circuit device $110_3$ where transporting heat to the active heat removal device 170 (see FIG. 1) at a minimal thermal conduction resistance in the z-direction is required.

Although FIGS. 1 and 2 illustrate specific configurations for the embodiments of the present description, it is understood that the anisotropic thermally conductive sections $150_1$, $150_2$, $150_3$ and the isotropic thermally conductive sections $160_1$ and $160_2$ may have any appropriate configuration to most effectively permit both low one-dimensional heat conduction resistance where needed and low heat spreading resistance where needed. As will be understood to those skilled in the art, the embodiments of the present description may enable the optimization of thermal resistances based on the power maps of the integrated circuit devices $110_1$, $110_2$, $110_3$ and limit thermal cross talk without negatively impacting the assembly or test steps in the fabrication of the integrated circuit package 100.

A thermal interface material 172, such as a grease or polymer having an enhanced thermal conductively, may be disposed between the first surface 142 of the heat dissipation device 140 and the second surface 114 (opposing the first surface 112) of each integrated circuit device $110_1$, $110_2$, and $110_3$ to facilitate heat transfer therebetween, to compensate for tolerances, and/or to compensate for any height (z-direction) differences between the integrated circuit device $110_1$, $110_2$, and $110_3$. The thermal interface material 172 may have an enhanced thermal conductivity "k" of at least about 2 to 3 W/m*K.

In one embodiment of the present description, the heat dissipation device 140 may include at least one footing 162 extending between the first surface 142 of the heat dissipation device 140 and the first surface 122 of the substrate 120, wherein the heat dissipation device footing 162 may be attached to the substrate first surface 122 with an attachment adhesive or sealant layer 164. As illustrated in FIG. 1, the heat dissipation device footing 162 may be a single material with at least one isotropic thermally conductive section $160_1$, $160_2$, such as where at least one isotropic thermally conductive section $160_1$, $160_2$ and the heat dissipation device footing 162 are formed substantially simultaneously by a single process step, including but not limited to stamping, skiving, molding, and the like. In various embodiments, the heat dissipation device footing 162 may be a plurality of walls, pillars, or the like, or may be a single "picture frame" structure surrounding the integrated circuit devices $110_1$, $110_2$, and $110_3$, as illustrated in FIG. 2. The attachment adhesive or sealant layer 164 may be any appropriate material, including, but not limited to, silicones (such as polydimethylsiloxane), epoxies, and the like. It is understood that the heat dissipation device footing 162 not only secures the heat dissipation device 140 to the substrate 120, but also maintains the desired distance D between the first surface 142 of the heat dissipation device 140 and the second surfaces 114 of at least one of the integrated circuit devices $110_1$, $110_2$, and $110_3$, usually measured from highest integrated circuit device when their heights vary. This distance may be referred to as the "bond line thickness".

It is further understood that an underfill material (not shown), such as an epoxy material, may be disposed between the integrated circuit devices $110_1$, $110_2$, $110_3$ and the substrate first surface 122, and surrounding the plurality of interconnects 126. The underfill material (not shown) may provide structural integrity and may prevent contamination, as will be understood to those skilled in the art.

Although the embodiments illustrated herein show three integrated circuit devices $110_1$, $110_2$, and $110_3$ aligned in the x-direction, it is understood that any appropriate number of integrated circuit devices may be used in any appropriate configuration in both the x-direction and the y-direction.

Figure 5:
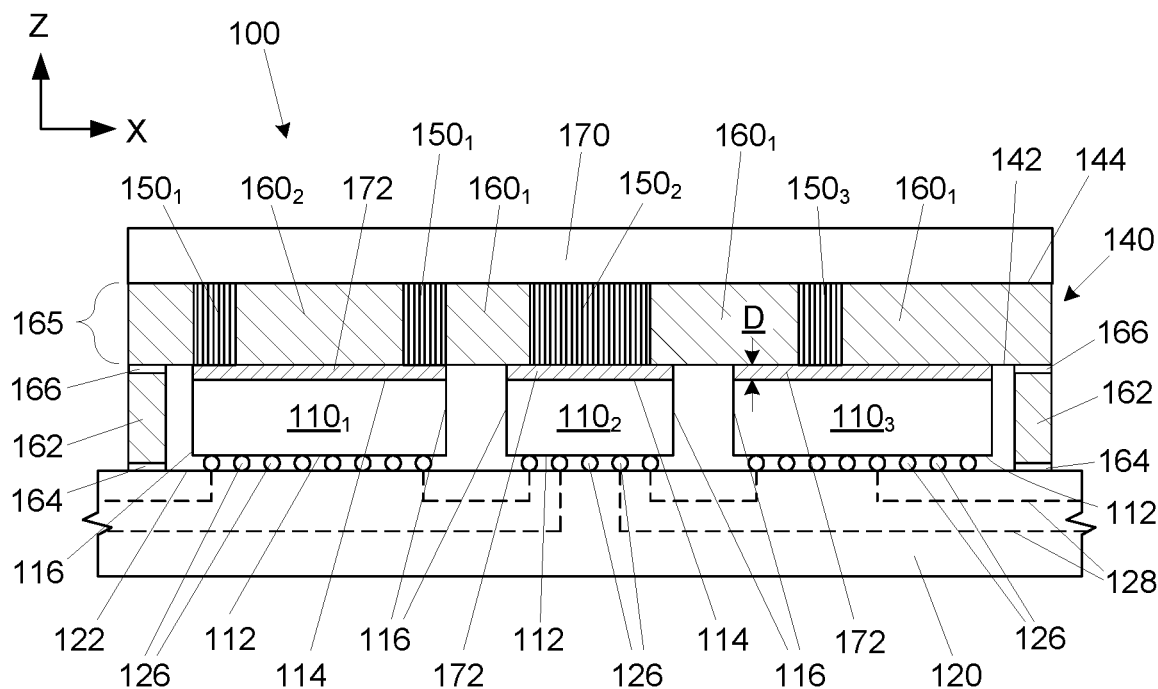
FIG. 5 is a side cross-sectional view of an integrated circuit package including a heat dissipation device comprising anisotropic thermally conductive sections and isotropic thermally conductive sections, wherein the heat dissipation device includes a separate footing attached thereto, according to one embodiment of the present description.

Although the heat dissipation device 140 illustrated in FIG. 1 shows the heat dissipation device footing 162 as a single material with at least one isotropic thermally conductive section $160_1$, the embodiments of the present description are not so limited. As shown in FIG. 5, in further embodiments of the present description, the heat dissipation device 140 may consist of at least two parts, wherein a main portion 165 (comprising the anisotropic thermally conductive sections $150_1$, $150_2$, $150_3$ and the isotropic thermally conductive sections $160_1$ and $160_2$) of the heat dissipation device 140 and the at least one heat dissipation device footing 162 are separate parts. As shown, the heat dissipation device footing 162 may be attached to the first surface 142 of the heat dissipation device 140 with an adhesive or sealant layer 166. Although fabricating the heat dissipation device 140 as a multiple piece assembly will take additional assembly steps, it may make the fabrication of the heat dissipation device 140 easier, as a whole. Again, the heat dissipation device footing 162 may be a plurality of walls, pillars, or the like, or may be a single "picture frame" structure surrounding the integrated circuit devices $110_1$, $110_2$, and $110_3$. The adhesive or sealant layer 166 may be any appropriate material, including, but not limited to silicones (such as polydimethylsiloxane), epoxies, and the like. In one embodiment, the adhesive or sealant layer 166 may be the same as the attachment adhesive or sealant layer 164.

Figure 6:
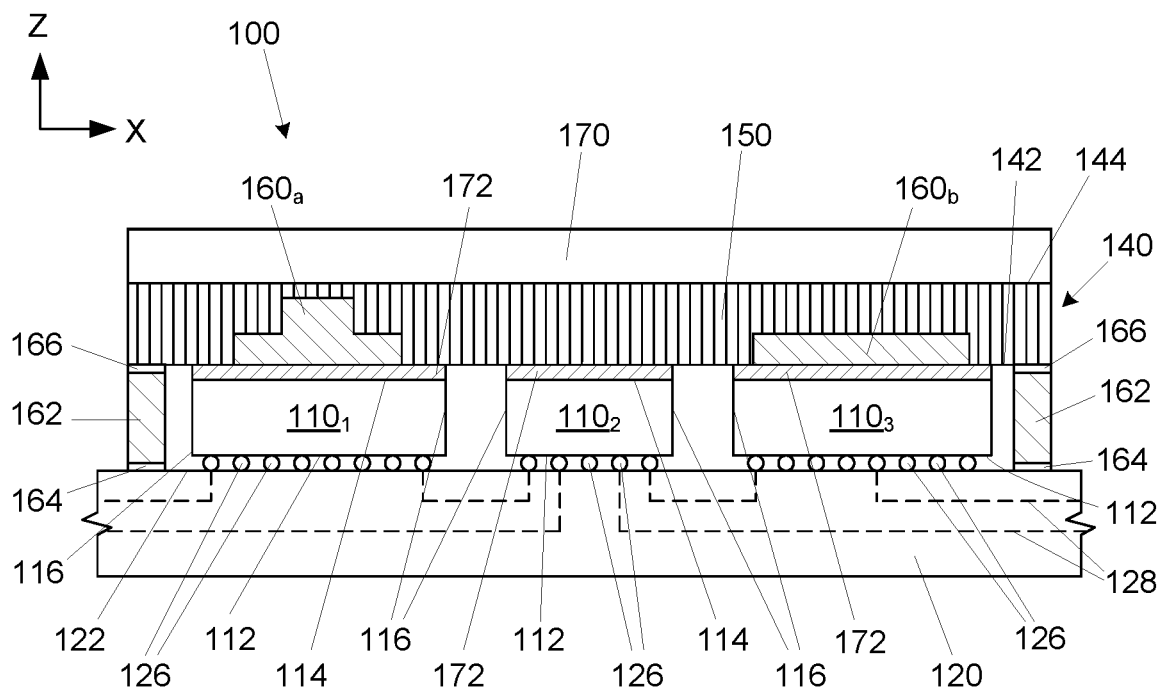
FIG. 6 is a side cross-sectional view of an integrated circuit package including a heat dissipation device comprising anisotropic thermally conductive sections and isotropic thermally conductive sections, wherein the anisotropic thermally conductive sections predominate the heat dissipation device, according to an embodiment of the present description.

In the embodiments of FIGS. 1-5, the isotropic thermally conductive sections $160_1$ and $160_2$ predominate (e.g. constitute more than 50% by volume of) the heat dissipation device 140. Thus, the heat dissipation device 140 may be formed by beginning with an isotropic thermally conductive material, removing portions of the thermally conductive material to form the isotropic thermally conductive sections $160_1$ and $160_2$, and then forming the anisotropic thermally conductive sections $150_1$, $150_2$, $150_3$ in the removed portions of the isotropic thermally conductive material. Alternatively, it may be advantageous to have the anisotropic thermally conductive section(s) predominate (e.g. constitute more than 50% by volume of) the heat dissipation device 140, such as shown in FIG. 6. Thus, the heat dissipation device 140 may be formed by beginning with an anisotropic thermally conductive material, removing portions of the anisotropic thermally conductive material to form anisotropic thermally conductive sections 150, and then forming isotropic thermally conductive sections 160a and 160b in the removed areas of the anisotropic thermally conductive material. The processes for the fabrication steps above are well known in the art and for purposes of brevity and conciseness will not be described herein.

Figure 7:
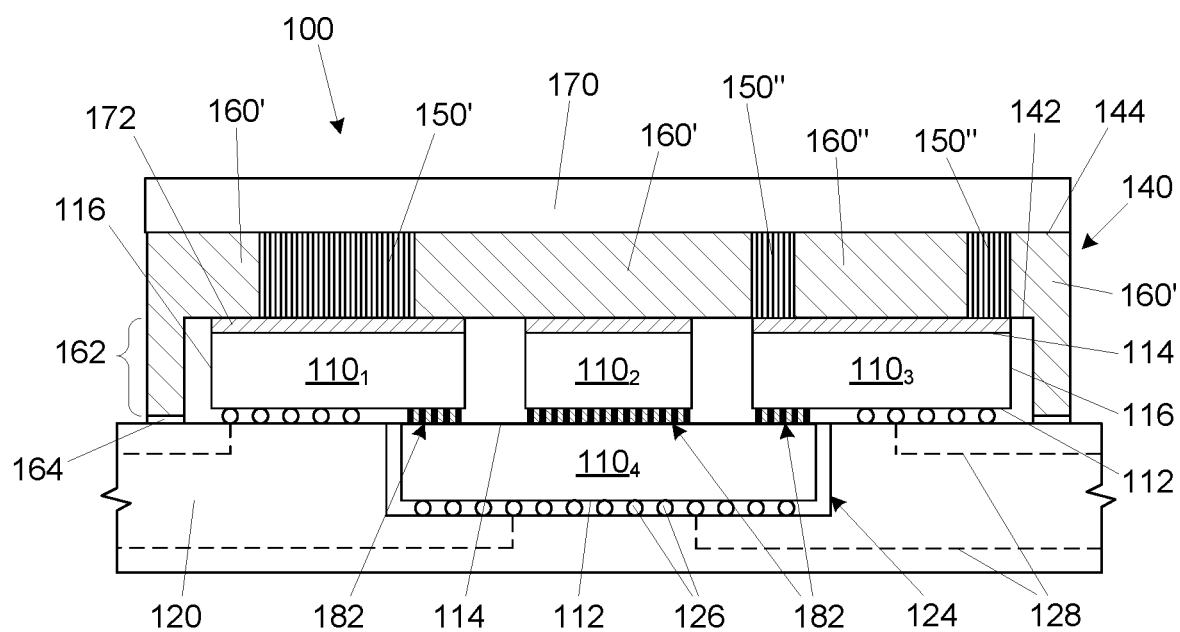
FIG. 7 is a side cross-sectional view of an integrated circuit package including a heat dissipation device in thermal contact with a stacked integrated circuit device configuration, according to another embodiment of the present description.

Although the illustrations of FIGS. 1-6 show a planar configuration for the integrated circuit devices $110_1$, $110_2$, and $110_3$, various embodiments of the present configuration are not so limited. As shown in FIG. 7, integrated circuit devices $110_1$, $110_2$, $110_3$, and $110_4$ may be assembled in a stacked configuration. As illustrated, the substrate 120 may include a cavity 124 formed therein and at least one additional integrated circuit device, illustrated as element $110_4$, may be at least partially disposed in the cavity 124. As with FIG. 1, the additional integrated circuit device $110_4$ may be electrically attached to the substrate 120 within the cavity 124 through device-to-substrate interconnects 126 extending from the first surface 112 of the additional integrated circuit $110_4$. At least one of the integrated circuit devices $110_1$, $110_2$, $110_3$ may be electrically attached to the second surface 114 of the additional integrated circuit device $110_4$, such as with high density interconnects 182, as known in the art, which may be in contact with integrated circuits (not shown) with through-silicon vias (not shown) within the additional integrated circuit device $110_4$. The heat dissipation device 140 may consist of anisotropic thermally conductive sections 150' and 150" and the isotropic thermally conductive sections 160' and 160", as shown.

Figure 8:
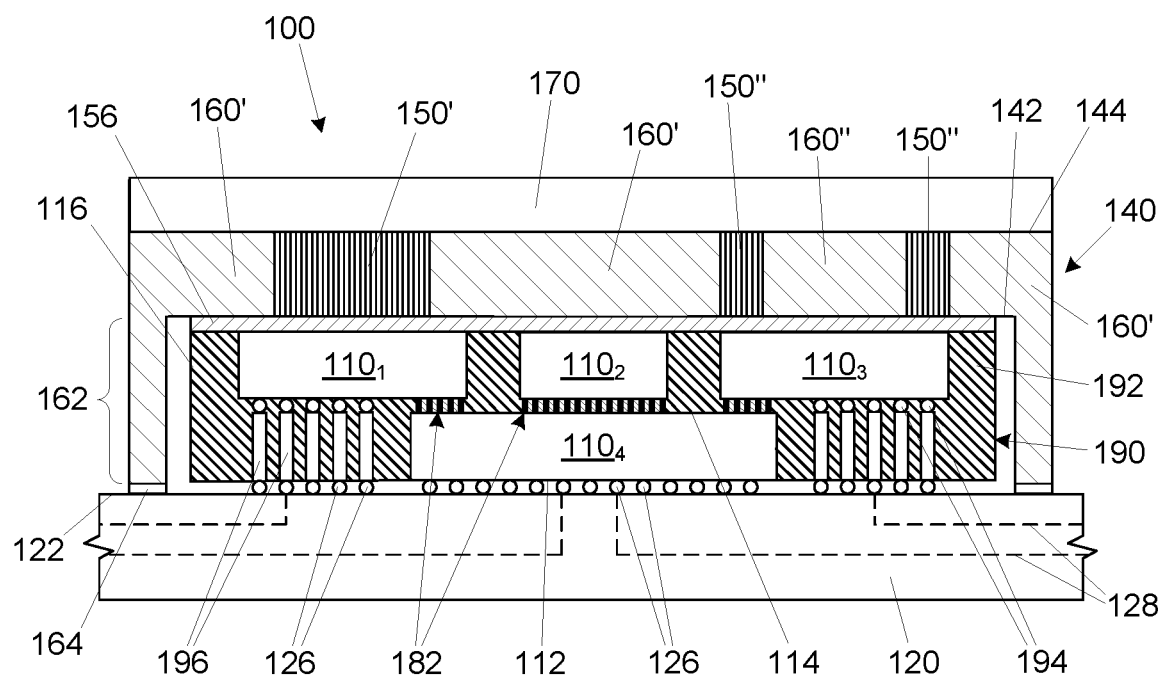
FIG. 8 is a side cross-sectional view of an integrated circuit package including a heat dissipation device in thermal contact with a stacked integrated circuit device configuration disposed in a mold material, according to another embodiment of the present description.

In a further embodiment shown in FIG. 8, a stacked configuration of integrated circuit devices $110_1$, $110_2$, $110_3$, and $110_4$ may be disposed in a mold material 192 to form a molded package 190. As with FIG. 7, the additional integrated circuit device $110_4$ may be electrically attached to the substrate 120 through device-to-substrate interconnects 126 from the first surface 112 of the integrated circuit $110_4$. At least one of the integrated circuit devices $110_1$, $110_2$, $110_3$ may be electrically attached to the second surface 114 of additional integrated circuit device $110_4$, such as with high density interconnects 182, which may be in contact with integrated circuits (not shown) with through-silicon vias (not shown) within the additional integrated circuit device $110_4$. At least one of the integrated circuit devices (illustrated as elements $110_1$ and $110_3$) may be electrically attached to the substrate 120 through device-to-substrate interconnects 126 which are electrically attached to through-mold interconnects 196 and device interconnect 194 within the molded package 190. The heat dissipation device 140 may consist of anisotropic thermally conductive sections 150' and 150" and the isotropic thermally conductive sections 160' and 160", as shown. The processes for the fabrication of a molded package 190 are well known in the art and for purposes of brevity and conciseness will not be described herein.

Figure 9:
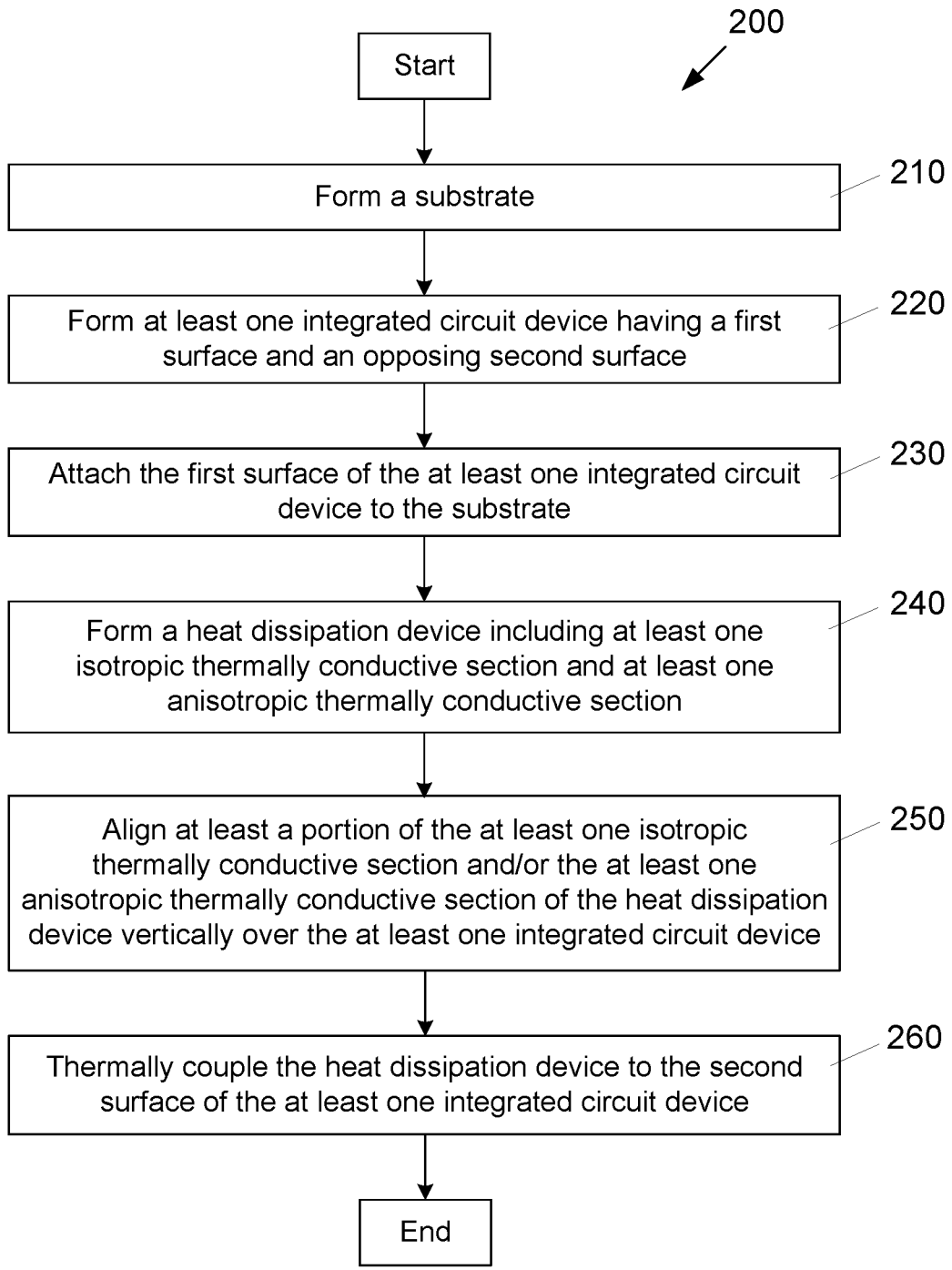
FIG. 9 is a flow chart of a process for fabricating an integrated circuit package, according to the present description.

FIG. 9 is a flow chart of a process 200 of fabricating an integrated circuit structure according to an embodiment of the present description. As set forth in block 210, a substrate may be formed. At least one integrated circuit device may be formed having a first surface and an opposing second surface, as set forth in block 220. As set forth in block 230, the first surface of the at least one integrated circuit device may be attached to the substrate. A heat dissipation device may be formed including at least one isotropic thermally conductive section and at least one anisotropic thermally conductive section, as set forth in block 240. As set forth in block 250, at least a portion of the at least one isotropic thermally conductive section and/or the at least one anisotropic thermally conductive section of the heat dissipation device may be vertically aligned over the integrated circuit device. The heat dissipation device may be thermally coupled to the second surface of the at least one integrated circuit device, as set forth in block 260.

Figure 10:
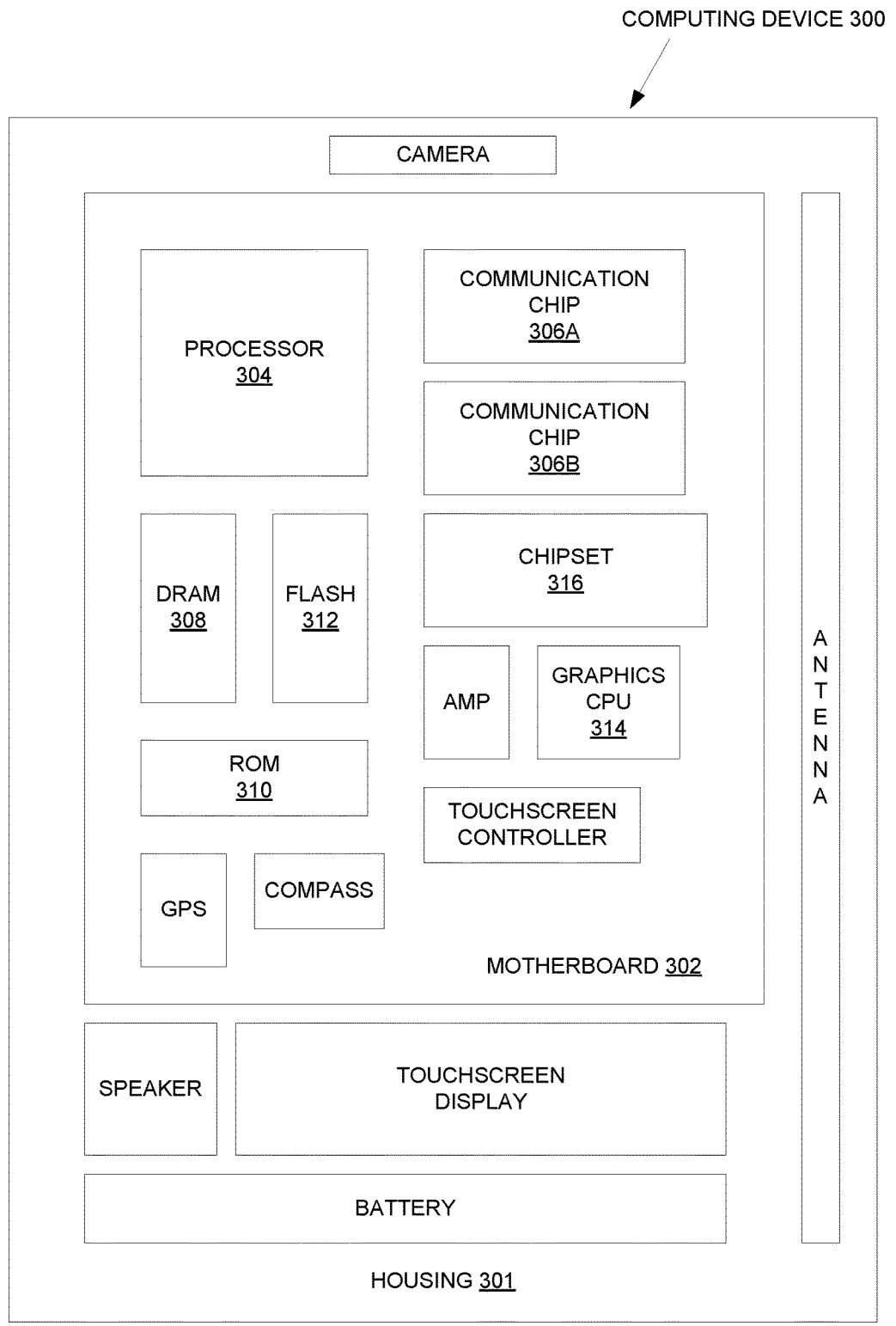
FIG. 10 is an electronic device/system, according to an embodiment of the present description.

FIG. 10 illustrates an electronic or computing device 300 in accordance with one implementation of the present description. The computing device 300 may include a housing 301 having a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include a thermal solution comprising a heat dissipation device, comprising at least one isotropic thermally conductive section (thermal conductivity in directions x, y, and z) and at least one anisotropic thermally conductive section (high thermal conductivity in at least one direction (e.g. z-direction) and low thermal conductivity in at least one other direction (e.g. x-direction and/or y-direction)).

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-10. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   at least one integrated circuit device;
   a heat dissipation device thermally coupled to the at least one integrated circuit device, wherein the heat dissipation device comprises at least one isotropic thermally conductive section laterally adjacent to at least one anisotropic thermally conductive section; and
   a thermal interface material, wherein a first section of the thermal interface material contacts the at least one anisotropic thermally conductive section of the heat dissipation device a second section of the thermal interface material contacts the at least one isotropic thermally conductive section, and at least one of the first or second sections of the thermal interface material contacts the at least one integrated circuit device.

2. The apparatus of claim 1, wherein the at least one anisotropic thermally conductive section comprises a plurality of thermally conductive rods embedded in a thermally insulative material.

3. The apparatus of claim 2, wherein the plurality of thermally conductive rods comprises carbon nanorods.

4. The apparatus of claim 2, wherein the plurality of thermally conductive rods comprises carbon nanotubes.

5. The apparatus of claim 1, wherein the at least one anisotropic thermally conductive section comprises a plurality of thermally conductive sheets embedded in a thermally insulative material.

6. The apparatus of claim 5, wherein the plurality of thermally conductive sheets comprises graphene sheets.

7. An apparatus, comprising:
   a substrate;
   at least one integrated circuit device having a first surface and an opposing second surface, wherein the first surface of the first integrated circuit device is electrically attached to the substrate; and
   a heat dissipation device thermally coupled to the second surface of the at least one integrated circuit device, wherein the heat dissipation device comprises at least one isotropic thermally conductive section laterally adjacent at least one anisotropic thermally conductive section; and a thermal interface material, wherein a first section of the thermal interface material contacts the at least one anisotropic thermally conductive section of the heat dissipation device wherein a second section of the thermal interface material contacts the at least one isotropic thermally conductive section of the heat dissipation device and wherein both of the first and second sections of the thermal interface material contact the second surface of the at least one integrated circuit device.

8. The apparatus of claim 7, wherein the at least one anisotropic thermally conductive section comprises a plurality of thermally conductive rods embedded in a thermally insulative material.

9. The apparatus of claim 8, wherein the plurality of thermally conductive rods comprises at least one of carbon nanorods and carbon nanotubes.

10. The apparatus of claim 7, wherein the at least one anisotropic thermally conductive section comprises a plurality of thermally conductive sheets embedded in a thermally insulative material.

11. The apparatus of claim 10, wherein the plurality of thermally conductive sheets comprises graphene sheets.

12. An apparatus, comprising:
a substrate;
at least one integrated circuit device having a first surface and an opposing second surface, wherein the first surface of the first integrated circuit device is electrically attached to the substrate; and
a heat dissipation device thermally coupled to the second surface of the at least one integrated circuit device, wherein the heat dissipation device comprises at least one isotropic thermally conductive section and at least one anisotropic thermally conductive section; and
a thermal interface material, wherein the thermal interface material contacts the at least one anisotropic thermally conductive section of the heat dissipation device and contacts the second surface of the at least one integrated circuit device; and
an additional integrated circuit device having a first surface and an opposing second surface, wherein the additional integrated circuit is in a stacked configuration with the at least one integrated circuit, wherein the first surface of the additional integrated circuit device is electrically attached to the substrate, and wherein the at least one integrated circuit device is electrically connected to the additional integrated circuit device.

13. The apparatus of claim 12, wherein the substrate further includes a cavity and wherein the additional integrated circuit is disposed at least partially in the cavity.

14. An electronic system, comprising:
a housing;
a board in the housing; and
the apparatus of claim 1,
wherein the at least one integrated circuit device is electrically attached to the board.

15. The electronic system of claim 14, wherein the at least one anisotropic thermally conductive section comprises a plurality of thermally conductive rods embedded in a thermally insulative material.

16. The electronic system of claim 15, wherein the plurality of thermally conductive rods comprises at least one of carbon nanorods and carbon nanotubes.

17. The electronic system of claim 14, wherein the at least one anisotropic thermally conductive section comprises a plurality of thermally conductive sheets embedded in a thermally insulative material.

18. The electronic system of claim 17, wherein the plurality of thermally conductive sheets comprises graphene sheets.

19. The electronic system of claim 14, further comprising an additional integrated circuit device having a first surface and an opposing second surface, wherein the additional integrated circuit is in a stacked configuration with the at least one integrated circuit, wherein the first surface of the additional integrated circuit device is electrically attached to the substrate, and wherein the at least one integrated circuit device is electrically connected to the additional integrated circuit device.

20. The electronic system of claim 19, wherein the substrate further includes a cavity and wherein the additional integrated circuit is disposed at least partially in the cavity.

* * * * *